(12) United States Patent
Liu et al.

(10) Patent No.: US 10,062,762 B2
(45) Date of Patent: Aug. 28, 2018

(54) SEMICONDUCTOR DEVICES HAVING LOW CONTACT RESISTANCE AND LOW CURRENT LEAKAGE

(71) Applicants: STMICROELECTRONICS, INC., Coppell, TX (US); GLOBALFOUNDRIES INC., Grand Cayman (KY); INTERNATIONAL BUSINESS MACHINES CORPORATION, Armonk, NY (US)

(72) Inventors: Qing Liu, Watervliet, NY (US); Xiuyu Cai, Niskayuna, NY (US); Chun-chen Yeh, Clifton Park, NY (US); Ruilong Xie, Schenectady, NY (US)

(73) Assignees: STMICROELECTRONICS, INC., Coppell, TX (US); GLOBALFOUNDRIES INC., Grand Cayman (KY); INTERNATIONAL BUSINESS MACHINES CORPORATION, Armonk, NY (US)

( * ) Notice: Subject to any disclaimer, the term of this patent is extended or adjusted under 35 U.S.C. 154(b) by 222 days.

(21) Appl. No.: 14/581,857

(22) Filed: Dec. 23, 2014

(65) Prior Publication Data
US 2016/0181390 A1    Jun. 23, 2016

(51) Int. Cl.
*H01L 23/485*    (2006.01)
*H01L 23/522*    (2006.01)
(Continued)

(52) U.S. Cl.
CPC ........ *H01L 29/45* (2013.01); *H01L 21/76816* (2013.01); *H01L 23/485* (2013.01);
(Continued)

(58) Field of Classification Search
CPC ............... H01L 23/485; H01L 23/5226; H01L 23/53238; H01L 23/53257; H01L 23/53266; H01L 23/535; H01L 23/5386; H01L 23/481; H01L 29/43; H01L 29/40; H01L 29/4908; H01L 29/4941;
(Continued)

(56) References Cited

U.S. PATENT DOCUMENTS 6,465,290 B1 * 10/2002 Suguro ............. H01L 29/66545
257/407
6,921,711 B2 * 7/2005 Cabral, Jr. ........ H01L 21/28079
257/E21.202
(Continued)

OTHER PUBLICATIONS

Wolf, Silicon Processing for the VLSI Era, vol. 2:Process Integration, Lattice Press, 1990, p. 398.*

*Primary Examiner* — David Zarneke
(74) *Attorney, Agent, or Firm* — Seed IP Law Group LLP

(57) ABSTRACT

The present disclosure is directed to a device and method for reducing the resistance of the middle of the line in a transistor. The transistor has electrical contacts formed above, and electrically connected to, the gate, drain and source. The electrical contact connected to the gate includes a tungsten contact member deposited over the gate, and a copper contact deposited over the tungsten contact member. The electrical contacts connected to the drain and source include tungsten portions deposited over the drain and source regions, and copper contacts deposited over the tungsten portions.

19 Claims, 13 Drawing Sheets

(51) Int. Cl.
  *H01L 23/532* (2006.01)
  *H01L 23/535* (2006.01)
  *H01L 23/538* (2006.01)
  *H01L 29/43* (2006.01)
  *H01L 29/40* (2006.01)
  *H01L 29/49* (2006.01)
  *H01L 29/45* (2006.01)
  *H01L 29/417* (2006.01)
  *H01L 29/78* (2006.01)
  *H01L 29/66* (2006.01)
  *H01L 21/768* (2006.01)
  *H01L 29/51* (2006.01)
  *H01L 23/48* (2006.01)

(52) U.S. Cl.
  CPC ...... *H01L 29/401* (2013.01); *H01L 29/66545* (2013.01); *H01L 29/66795* (2013.01); *H01L 29/7851* (2013.01); *H01L 23/481* (2013.01); H01L 23/5226 (2013.01); *H01L 23/535* (2013.01); *H01L 23/5386* (2013.01); *H01L 23/53238* (2013.01); *H01L 23/53257* (2013.01); *H01L 23/53266* (2013.01); *H01L 29/517* (2013.01)

(58) Field of Classification Search
  CPC . H01L 29/4958; H01L 29/495; H01L 29/456; H01L 29/4178; H01L 29/4966; H01L 29/7851; H01L 29/66545; H01L 29/401; H01L 29/41783; H01L 29/517; H01L 29/66795; H01L 29/45; H01L 21/743; H01L 21/823871; H01L 21/76886; H01L 21/82345; H01L 21/823437; H01L 21/823475; H01L 21/41783; H01L 21/28079; H01L 21/03
  See application file for complete search history.

(56) References Cited

U.S. PATENT DOCUMENTS

| | | | | |
|---|---|---|---|---|
| 7,348,676 B2* | 3/2008 | Lee | ............... | H01L 21/76802 257/751 |
| 7,741,224 B2* | 6/2010 | Jiang | ............... | H01L 21/3105 257/759 |
| 7,910,994 B2* | 3/2011 | Yu | ............... | H01L 29/41791 257/347 |
| 8,124,531 B2 | 2/2012 | Chandrashekar et al. | | |
| 8,232,647 B2* | 7/2012 | Yang | ............... | H01L 21/76847 257/741 |
| 8,735,960 B2* | 5/2014 | Tran | ............... | H01L 23/485 257/316 |
| 8,823,099 B2* | 9/2014 | Huang | ............... | H01L 29/6653 257/344 |
| 8,841,755 B2* | 9/2014 | Huang | ............... | H01L 23/481 257/621 |
| 8,898,068 B2* | 11/2014 | Subbaraman | ............... | G10L 19/0017 704/205 |
| 8,952,535 B2* | 2/2015 | Haneda | ............... | H01L 27/088 257/751 |
| 9,054,172 B2* | 6/2015 | Hung | ............... | H01L 23/485 |
| 9,076,726 B2* | 7/2015 | Kauerauf | ............... | H01L 21/28176 |
| 9,246,002 B2* | 1/2016 | Hsiao | ............... | H01L 29/66492 |
| 9,263,392 B1* | 2/2016 | Lin | ............... | H01L 29/785 |
| 9,331,076 B2* | 5/2016 | Bayram | ............... | H01L 21/823807 |
| 9,502,434 B2* | 11/2016 | Tanaka | ............... | H01L 29/78606 |
| 2007/0161170 A1* | 7/2007 | Orlowski | ............... | H01L 29/41791 438/197 |
| 2008/0265419 A1* | 10/2008 | Frohberg | ............... | H01L 21/76843 257/753 |
| 2009/0017563 A1* | 1/2009 | Jiang | ............... | H01L 21/3105 438/4 |
| 2009/0096002 A1* | 4/2009 | Yu | ............... | H01L 29/41791 257/308 |
| 2010/0123178 A1* | 5/2010 | Tran | ............... | H01L 23/485 257/316 |
| 2011/0042752 A1* | 2/2011 | Mayuzumi | ............... | H01L 21/28518 257/369 |
| 2011/0068411 A1* | 3/2011 | Sun | ............... | H01L 21/76804 257/384 |
| 2011/0095379 A1* | 4/2011 | Wong | ............... | H01L 21/28079 257/402 |
| 2012/0104471 A1* | 5/2012 | Chang | ............... | H01L 21/76838 257/288 |
| 2013/0140634 A1* | 6/2013 | Chan | ............... | H01L 21/76886 257/347 |
| 2013/0264652 A1* | 10/2013 | Zhu | ............... | H01L 21/28088 257/369 |
| 2014/0027822 A1* | 1/2014 | Su | ............... | H01L 29/66545 257/288 |
| 2015/0228543 A1* | 8/2015 | Yu | ............... | H01L 21/823437 257/739 |
| 2015/0263133 A1* | 9/2015 | Yamamoto | ............... | H01L 29/665 438/300 |
| 2016/0035623 A1* | 2/2016 | Shao | ............... | H01L 21/76879 257/774 |

* cited by examiner

SEMICONDUCTOR DEVICES HAVING LOW CONTACT RESISTANCE AND LOW CURRENT LEAKAGE

JOINT RESEARCH AGREEMENT

The subject matter claimed herein was made as a result of activities undertaken within the scope of a joint research agreement. The parties to the joint research agreement are (1) STMicroelectronics, Inc., and (2) International Business Machines Corporation.

BACKGROUND

Technical Field

The present disclosure is directed to semiconductor devices and, in particular, semiconductor devices having a reduced middle of the line resistance.

Description of the Related Art

Modern integrated circuits often include a large number of transistors, generally field effect transistors, which are interconnected with other transistors or devices. These transistors generally include interconnect contacts for the drain, source and gate of the transistor. Wiring is connected to the interconnect contacts of individual transistors in order to connect the transistors to other transistors and devices.

Integrated circuits are fabricated in several stages. In the first stage, referred to as the front end of the line (FEOL), individual devices such as transistors are patterned in the semiconductor. While the transistors and other devices are patterned in the FEOL stage, connection contacts to the gate, drain and source of the individual devices are created in a middle of the line (MOL) stage. The back end of the line (BEOL) comes after the transistors are formed, and is when the individual devices are connected to one another with wiring on the semiconductor wafer.

In the MOL stage, connectors to the gate, drain and source of transistors are formed. The MOL stage involves adding a trench silicide layer (TS), generally made of tungsten, to the source and drain, and forming a tungsten contact layer (CA) over the TS. The TS and CA layers both require the use of a liner, such as a TiN liner. The tungsten contact, CA, in addition to the TiN liner adds significant resistance to the connections formed in the MOL stage because tungsten has a low conductivity compared to other metals such as copper.

The gate of the transistor undergoes a similar process during the MOL stage, having a second tungsten contact layer (CB) formed over the gate conductor, with a liner material such as TiN between the gate conductor and CB. The tungsten contact layer, CB, and the related TiN liner also add significant resistance to the gate conductor contact in the MOL stage. Tungsten is used for the contacts CA and CB instead of the more conductive material copper in order to remove the dangers of diffusion when copper is deposited close to the gate, drain and source. However, the use of tungsten also adds significantly higher resistance to the contacts because tungsten has a much lower conductivity than copper.

As integrated circuits continue to scale down in size from 10 nm to 7 nm, reducing the resistance of the connections created in the MOL step is becoming an important part of semiconductor fabrication.

BRIEF SUMMARY

The present disclosure is directed to a transistor having electrical contacts over a gate conductor, source region and drain region. According to one embodiment, the electrical contact of the gate conductor includes a tungsten contact member overlying the gate conductor, and a copper contact overlying the tungsten contact member. The electrical contacts of the source and drain regions include tungsten portions overlying the source and drain regions, and copper contacts overlying the tungsten portions.

According to a further embodiment, the transistor has a substrate, with the gate, drain and source overlying the substrate, and a channel connecting the drain and source lying under the gate. The electrical contacts formed over the gate, drain and source allow connections to be made from the respective gate, drain and source to other devices in an integrated circuit in which the transistor is formed. The use of copper as one of the metal layers in the contacts helps to reduce the resistance of the electrical contacts for the gate, source and drain.

Namely, a contact will be two distinct different metals as opposed to an alloy of two metals. One layer of metal will be used to contact with the gate and the substrate, such as tungsten, aluminum or titanium, and the other layer has a higher conductivity, such as copper. Because copper can pollute or ruin the semiconductor substrate and in some cases the gate, it is difficult to use copper in a contact to the substrate. With the principles as taught herein, copper can be a second metal layer, on top of the first contact metal.

DETAILED DESCRIPTION

Figure 1:
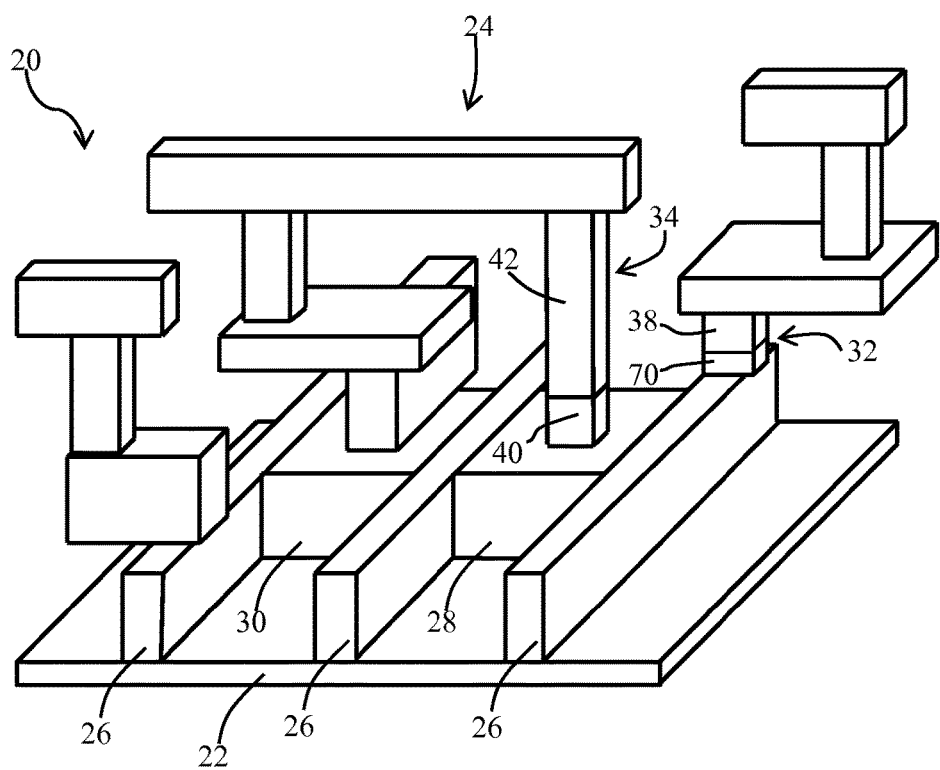
FIG. 1 is an isometric view of a semiconductor device according to one embodiment of the present disclosure.

In the following description, certain specific details are set forth in order to provide a thorough understanding of the various embodiments of the disclosure. However, one skilled in the art will understand that the disclosure may be practiced without these specific details. In some instances, well-known structures associated with semiconductor manufacturing have not been described in detail to avoid obscuring the descriptions of the embodiments of the present disclosure.

Unless the context requires otherwise, throughout the specification and claims that follow, the word "comprise" and variations thereon, such as "comprises" and "comprising," are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the drawings, identical reference numbers identify similar features or elements. The size and relative positions of features in the drawings are not necessarily drawn to scale.

FIG. 1 shows an integrated circuit 20 according to one embodiment of the present disclosure. The integrated circuit 20 has a semiconductor substrate 22, with a transistor 24 formed thereon. The transistor is preferably a 3D transistor, such as a finFET, but may also be a planar transistor in some embodiments. According to some embodiments, the transistor 24 is a 10 nm transistor or a 7 nm transistor. The transistor 24 includes a gate conductor 26, a drain region 28 and a source region 30 formed over the semiconductor substrate 22. The substrate 22 is preferably composed of a silicon containing material, such as Si, SiGe, or any other suitable material for forming semiconductor substrates.

During the middle of the line (MOL) processing, a first electrical contact 32 is formed over the gate conductor 26, and second electrical contacts 34 are formed over the source and drain regions. These contacts allow for connections from the gate conductor 26, source region 30, and drain region 28 to other devices. The first electrical contact 32 has a first copper contact 38 electrically coupled to the gate conductor 26. The second electrical contact 34 includes a trench silicide layer 40 overlying the source and drain regions, and copper contacts 42 overlying the trench silicide layer 40. Because of the small scale of the transistor 24, the trench silicide layer 40 and copper contacts 38 and 42 have narrow widths to avoid shorting to one another, preferably less than 10 nm.

Figure 2:
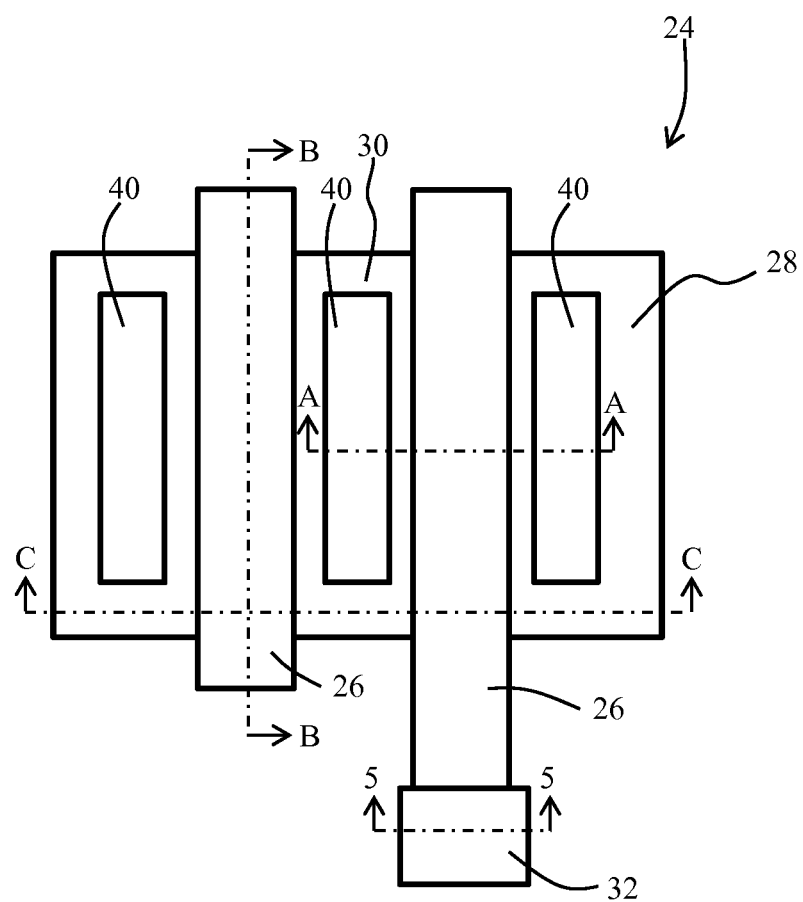
FIG. 2 is a top down view of a semiconductor device according to one embodiment of the present disclosure.

FIG. 2 is a partial top view of the transistor 24 according to one embodiment of the present disclosure. The gate conductor 26 is formed between the drain region 28 and the source region 30 of the transistor 24, and extends beyond the drain region and source region according to some embodiments as shown in FIG. 2. The first electrical contact 32 overlies a portion of the gate conductor 26. According to one embodiment, the first electrical contact 32 is separated from the remainder of the transistor 24 along the gate conductor 26. The first copper contact 38 is formed on the top of the first electrical contact 32, and is exposed to allow wiring to be connected to the first electrical contact 32 to form a connection between the gate conductor 26 and other devices.

The second electrical contact 34 includes the trench silicide layer 40 overlying the drain region 28 and source region 30, and the second copper contact 42 overlying the trench silicide layer 40. The second copper contact 42 forms the top of the second electrical contact 34, and is exposed on top of the transistor 24. Wiring can connect to the second copper contact 42 in order to connect the source and drain regions to other devices.

Figure 3A:
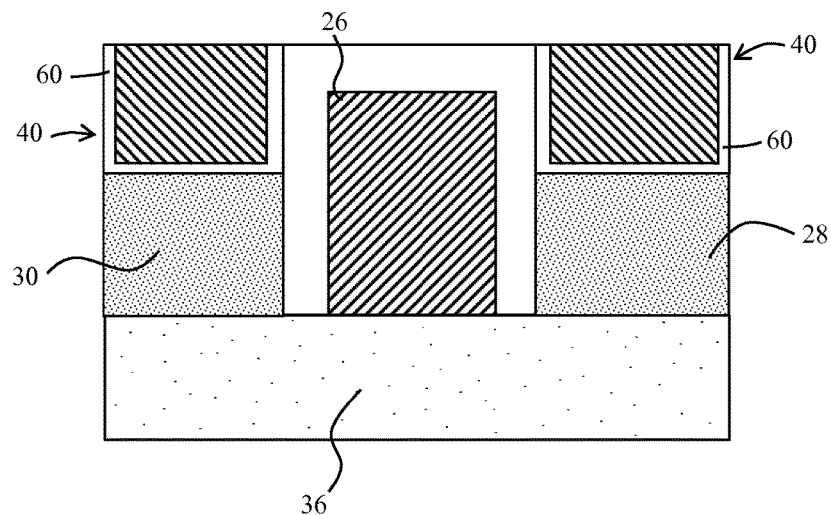
FIG. 3A is a cross-section view of the semiconductor device of FIG. 2 along the A-A line.

FIG. 3A shows a cross-section view of the drain region 28, source region 30, gate conductor 26 and a channel 36 along the A-A line of FIG. 2. The drain region 28 and the source region 30 are connected to one another via the channel 36, which allows current to flow between the source region 30 and the drain region 28 when a voltage is applied to the gate conductor 26. The gate conductor 26 overlies the channel between the drain region 28 and source region 30, wrapping around the channel 36 as shown in FIG. 3B.

Figure 3B:
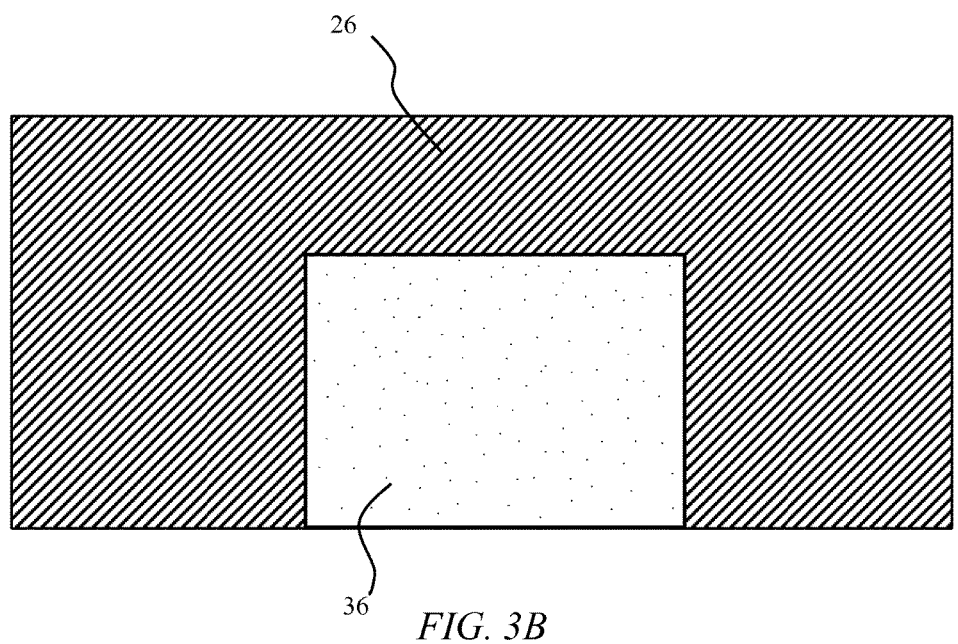
FIG. 3B is a cross-section view of the semiconductor device of FIG. 2 along the B-B line.

FIG. 3B shows a cross-section view of the gate conductor 26 and channel 36 along the B-B line of FIG. 2. As shown in FIG. 3A, the gate conductor 26 overlies the channel 36, and is formed between the source region and drain region. The gate conductor 26 wraps around the sides and top of the channel 36, forming an upside down U shape over the channel 36. The drain and source regions are connected to the channel 36 on either side of the gate conductor 26, as shown in FIG. 3A.

Figure 3C:
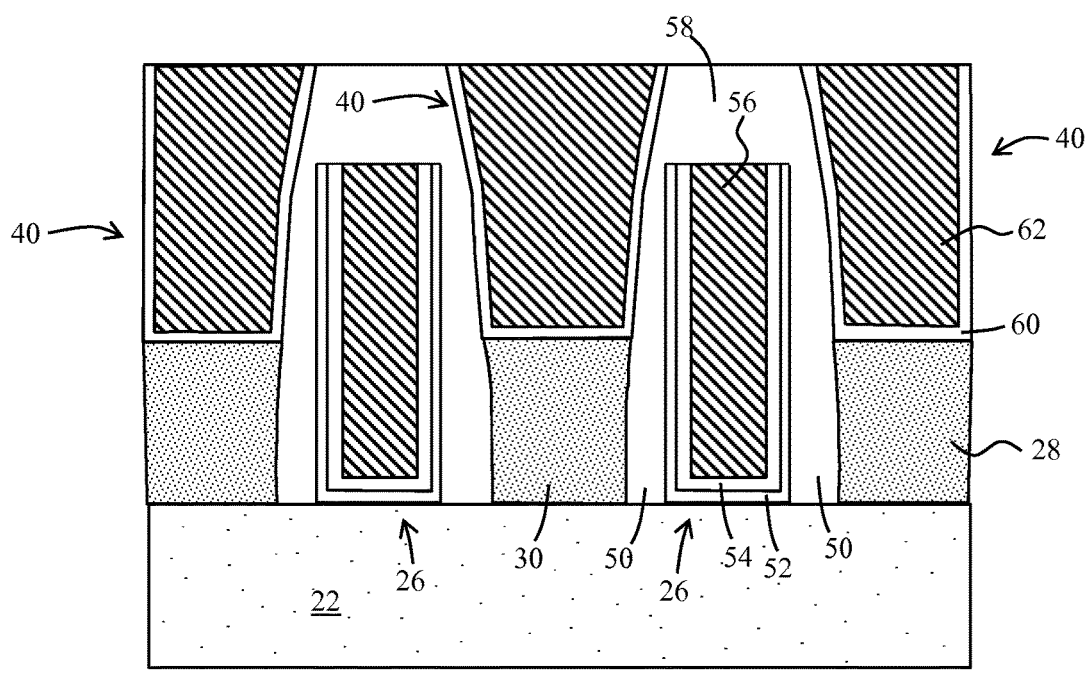
FIG. 3C is a cross-section view of the semiconductor device of FIG. 2 along the C-C line.

FIG. 3C shows a cross-section view of the transistor 24 along the C-C line of FIG. 2. The drain region 28 and source region 30 are formed over the substrate 22, with the gate conductor 26 formed therebetween as describe above with respect to FIGS. 3A and 3B.

Forming a transistor is well known in the art and will only be briefly discussed here. The gate conductor 26 is formed by first forming a polysilicon dummy gate structure over the substrate 22, with a sacrificial hardmask on top of the polysilicon dummy gate structure. The hardmask may be made of any suitable material, such as SiN. Next, a spacer 50, preferably made of SiN, $SiO_2$, or any other suitable material, is formed on the sidewall of the dummy gate structure, between the dummy gate structure and the drain region 28 and source region 30. After the spacer 50 is formed, the drain region 28 and source region 30 are raised vertically by growing an in-situ phosphorous doped silicon or SiC epitaxial layer for NFET devices, and an in-situ boron doped silicon or SiGe epitaxial layer for PFET devices. A $SiO_2$ dielectric layer is then deposited over the source and drain regions up to the SiN hardmask. Next the SiN hardmask is removed, and the polysilicon dummy gate structure is removed through a wet-etch process, while leaving the spacer 50 in place. The recess left by removing the dummy gate structure has a first liner 52 deposited therein, the first liner 52 being a high-K dielectric, such as hafnium dioxide or hafnium silicate. A second liner 54 is deposited over the first liner 52, the second liner 54 being a workfunction metal, such as TiN or TiC. A first tungsten fill 56 is then deposited over the second liner 54. The first tungsten fill 56 and first and second liners 52, 54 are then recessed below the previously formed $SiO_2$ dielectric layer, and the resulting recess is filled with a SiN cap 58. The trench silicide 40 is formed by etching and removing the $SiO_2$ dielectric layer over the source and drain regions, and a TiN liner 60 is deposited in the resulting recess. The TiN liner 60 is generally deposited by atomic layer deposition, but can be deposited using any suitable method. A second tungsten fill 62 is deposited over the TiN liner 60, and the second tungsten fill 62 and TiN liner 60 are polished via CMP or any other suitable method to be at the same level as the SiN cap 58.

Figure 4:
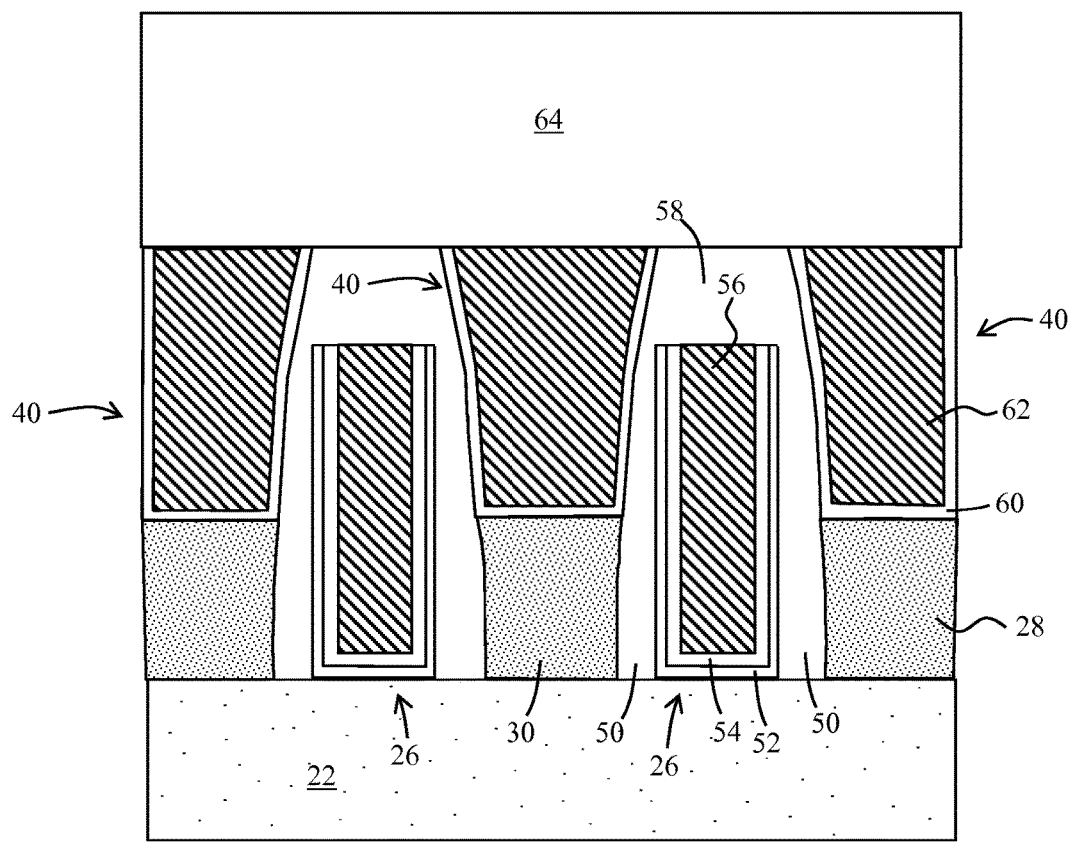
FIG. 4 is a cross-sectional view of a semiconductor device prior to forming interconnect contacts according to one embodiment of the present disclosure.

FIG. 4 shows the transistor 24 with an insulating layer 64 formed over top of the structure, covering the trench silicide 40 and SiN cap 58. The insulating layer 64 may be any suitable material, such as $SiO_2$.

Figure 5:
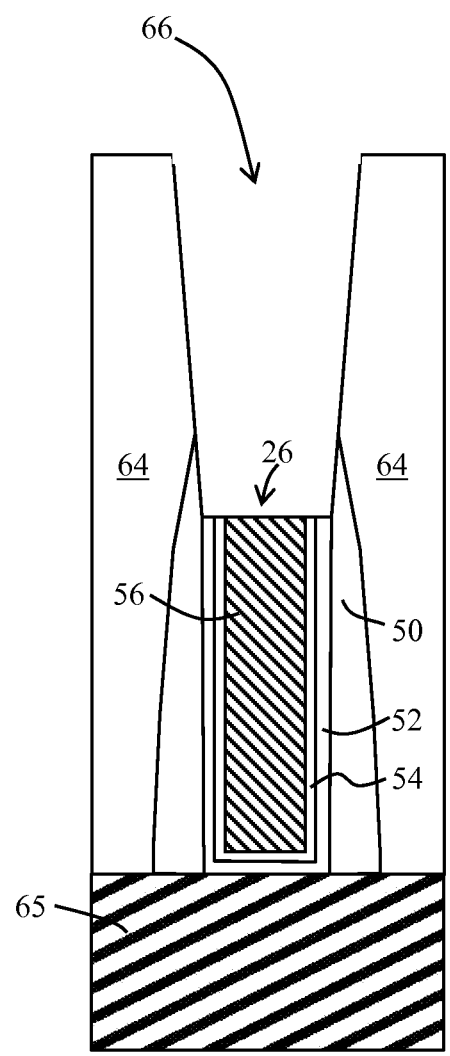
FIG. 5 is a cross-sectional view of the gate conductor of FIG. 2 along the 5-5 line.

FIG. 5 shows a cross-section of the gate conductor 26 along the 5-5 line before the first electrical contact 32 is formed. The gate conductor 26 extends beyond the drain and source regions, as shown in FIG. 2, and the first electrical contact 32 is preferably formed on a portion of the gate conductor 26 extending beyond the source and drain regions. The gate conductor 26 overlies a $SiO_2$ insulator 65. FIG. 5 shows a portion of the gate conductor 26 after having the SiN cap 58 and insulator 64 etched and removed from the portion. The first tungsten fill 56 of the gate conductor 26 is exposed after the SiN cap 58 is removed, forming a recess 66 in the portion of the gate conductor 26 where the SiN cap 58 and insulator 64 are etched and removed.

Figure 6:
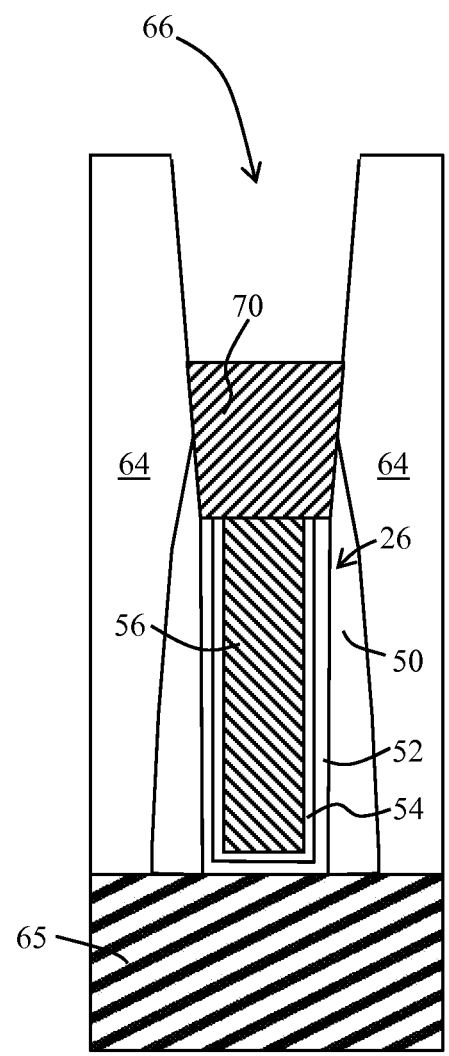
FIG. 6 is a cross-sectional view of a gate conductor having a tungsten contact member according to one embodiment of the present disclosure.

FIG. 6 shows a cross-section view of the portion of the gate conductor 26 with a tungsten contact member 70. After etching and removing the insulator 64 and SiN cap 58 in FIG. 5, the tungsten contact member 70 is selectively deposited over the first tungsten fill 56 in the recess 66. Because the contact member 70 and first tungsten fill 56 are both made of tungsten, no liner is needed to deposit the tungsten contact member 70, thus reducing the resistance of the gate conductor 26. Selective tungsten deposition methods are known in the art, one example of which is found in U.S. Pat. No. 8,124,531, which is incorporated herein in its entirety.

Figure 7:
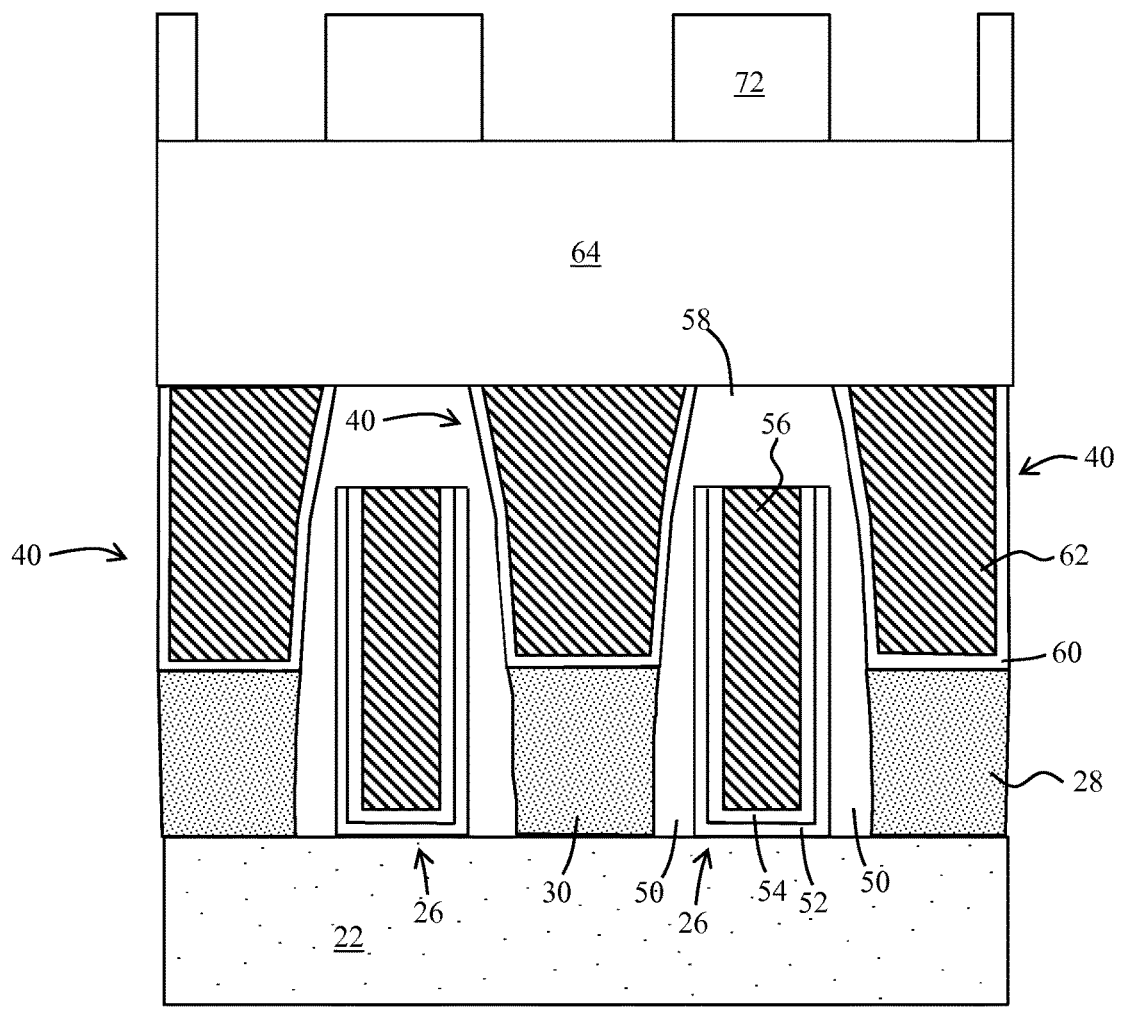
FIG. 7 is a cross-sectional view of the semiconductor device of FIG. 4 having a masking layer according to one embodiment of the present disclosure.
Figure 8:
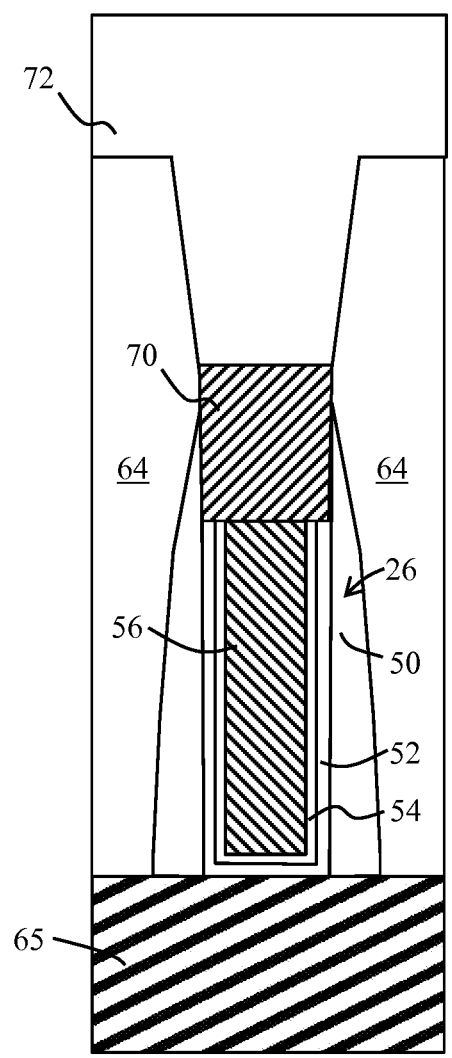
FIG. 8 is a cross-sectional view of the gate conductor of FIG. 6 having a masking layer according to one embodiment of the present disclosure.

FIGS. 7 and 8 show a masking layer 72 being deposited over the transistor 24. Although the masking layer 72 is shows as a single layer for simplicity, it will be appreciated that the masking layer 72 may have multiple layers, for example a photoresist layer, an optical planarization layer, and an anti-reflective coating layer. The masking layer 72 covers the gate conductor 26 of the transistor 24, leaving the areas above the drain region 28 and source region 30 exposed. The masking layer 72 is also deposited into the recess 66 formed in the portion of the gate conductor 26 having the tungsten contact member 70, allowing the masking layer 72 to cover the tungsten contact member 70.

Figure 9:
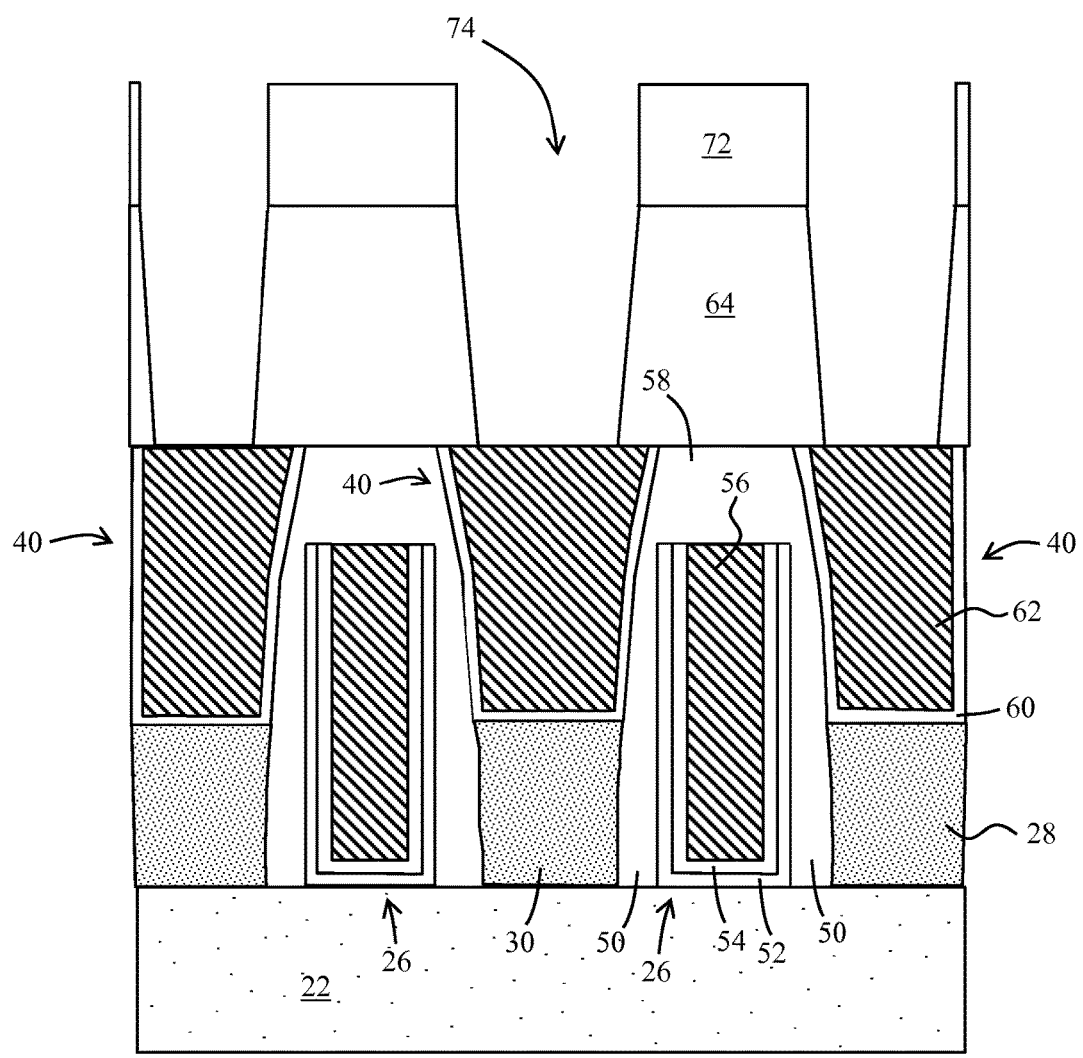
FIG. 9 is a cross-sectional view of a semiconductor device having etched recesses according to one embodiment of the present disclosure.

FIG. 9 shows the insulator 64 being etched and removed in areas not covered by the masking layer 72, particularly above the drain region 28 and source region 30. The etching process is preferably a reactive ion etch, but can be any suitable process for removing the insulator layer 64. The insulator 64 is etched and removed to the second tungsten fill 62, creating a recess 74 in the insulator 64 above the trench silicide 40.

Figure 10:
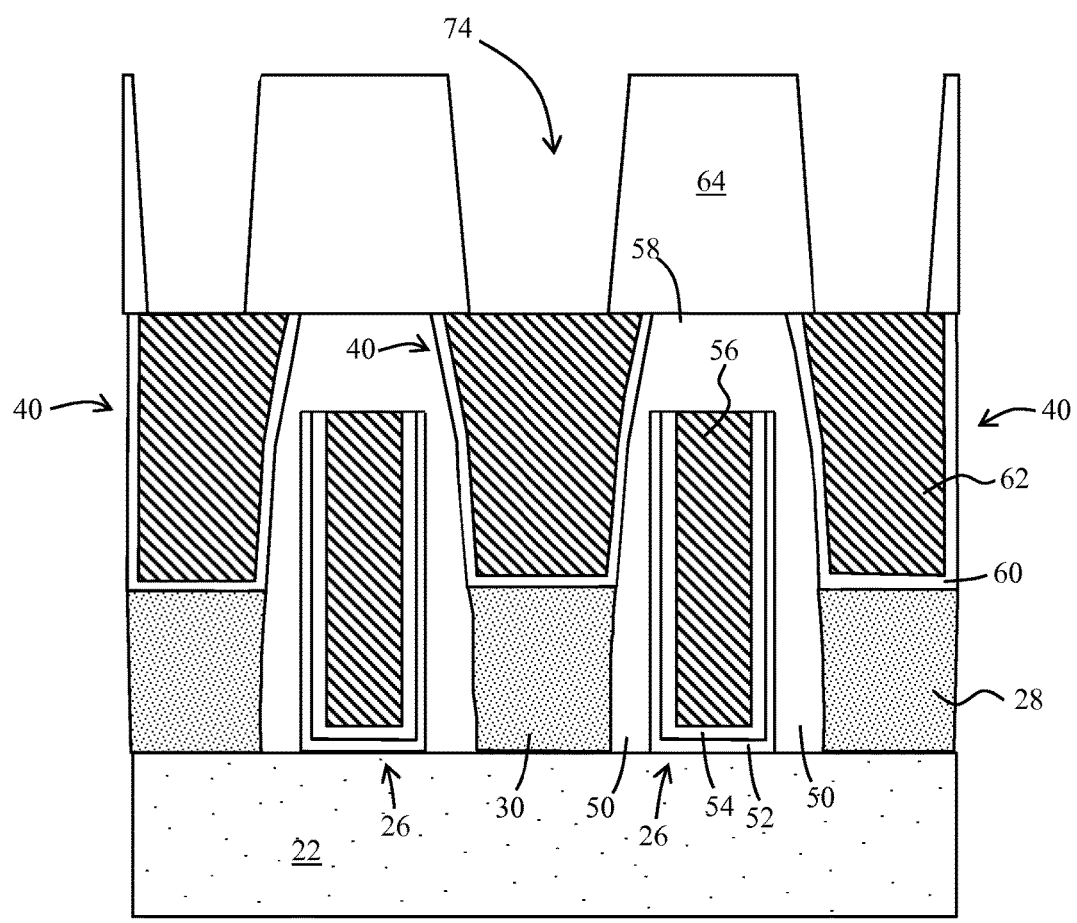
FIG. 10 is a cross-sectional view of the semiconductor device of FIG. 9 without the masking layer according to one embodiment of the present disclosure.

FIG. 10 shows the masking layer 72 being removed by any suitable method, such as a plasma ashing process. The tungsten contact member 70 protects the portion of the gate conductor 26 from damage during the ashing process. When the masking layer 72 is removed from the portion of the gate conductor 26 having the tungsten contact member 70, the recess 66 is re-created above the tungsten member 70.

Figure 11:
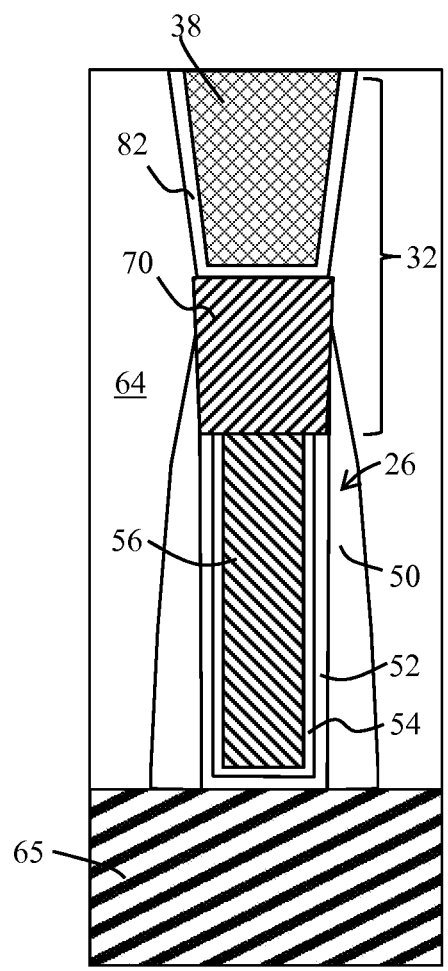
FIG. 11 is a cross-sectional view of a gate conductor having a copper contact according to one embodiment of the present disclosure.

FIG. 11 shows the first copper contact 38 being deposited in the recess 66 over the tungsten contact member 70. The first copper contact 38, in combination with the tungsten contact member 70 form the first electrical contact 32 connected to the gate conductor 26. In some embodiments, the first copper contact 38 has a first barrier liner 82 deposited into the recess 66 before the first copper contact 38 in order to prevent diffusion from the copper contact 38 into the tungsten contact member 70. The copper contact 38 and diffusion barrier 82 are then polished to be flush with the insulator 64.

The tungsten contact member 70 helps prevent diffusion from the first copper contact 38 into the gate conductor 26, thus allowing the copper contact 38 to be used instead of a traditional tungsten contact. Copper has a much lower resistivity than tungsten, and therefore the copper contact 38 results in reduced resistance in the first electrical contact 32 compared to previous tungsten contacts.

Figure 12:
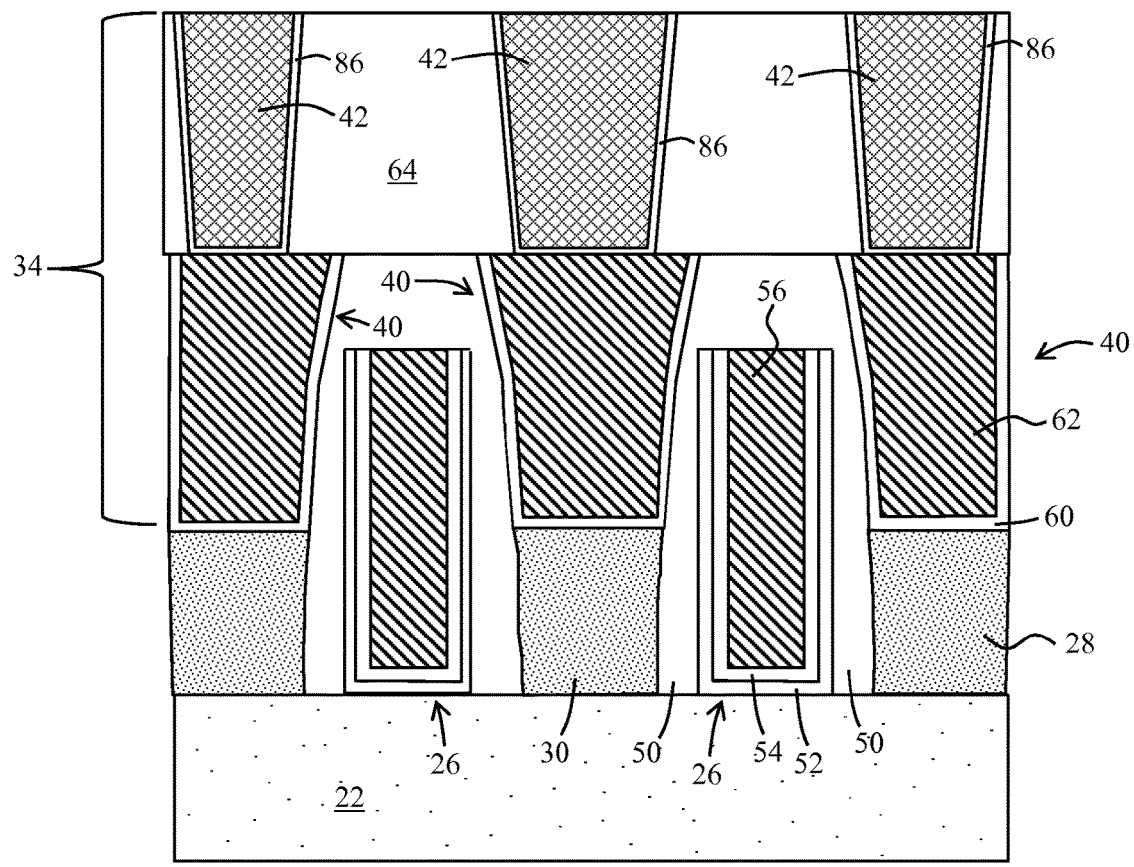
FIG. 12 is a cross-sectional view of a semiconductor device having a copper contact according to one embodiment of the present disclosure.

FIG. 12 shows a second copper contact 42 being deposited in the recesses 74 above the source region 30 and drain region 28. In some embodiments, a second barrier liner 86 is deposited into the recess 74 before the second copper contact 42 is deposited to prevent diffusion of the second copper contact 42 into the second tungsten fill 62. The first and second barrier liners can be made of any material suitable for preventing copper diffusion, such as TiW, TiN, Ta, TaN, Ta—Si—N or $WN_x$.

The second tungsten fill 62 above the source region 30 and drain region 28 help to prevent diffusion from the second copper contact 42 into the source region 30 and drain region 28. Similarly to the gate electrical contact 32, the second electrical contact 34 has reduced resistance because of the use of the second copper contacts 42 instead of traditional tungsten contacts.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a substrate having a surface;
   a source region overlying the substrate;
   a drain region overlying the substrate;
   a channel overlying the substrate and extending between the source region and the drain region, the channel having an upper surface opposite the substrate and including sides orthogonal to the surface of the substrate;
   an inverted U-shaped gate structure overlying the substrate and formed around the upper surface and sides of the channel, the inverted U-shaped gate structure including,
      a first U-shaped liner on the substrate, the first U-shaped liner being formed from a high-K dielectric material and including sidewalls orthogonal to the surface of the substrate;
      a second U-shaped liner formed over the first U-shaped liner, the second U-shaped liner being formed from a work function metal material and including a lower surface proximate the substrate and sidewalls orthogonal to the surface of the substrate; and
      a first tungsten fill over the lower surface and sidewalls of the second U-shaped liner;
   a first electrical contact connected to the first tungsten fill of the gate structure, the first electrical contact including:
      a tungsten contact member selectively deposited, overlying and in direct contact with the first tungsten fill; and a first copper portion overlying the tungsten contact member; and
a second electrical contact connected to the source region, the second electrical contact including:
a titanium nitride liner overlying the source region;
a second tungsten portion overlying the titanium nitride liner; and
a second copper portion overlying the second tungsten portion.

2. The device of claim 1, wherein the device is a FinFET transistor.

3. The device of claim 1, wherein the first electrical contact further includes a diffusion barrier liner overlying the tungsten contact member.

4. The device of claim 1, wherein the second electrical contact further includes a diffusion barrier liner overlying the second tungsten portion.

5. A device, comprising:
a transistor, having
a source region of a silicon substrate;
a drain region of the silicon substrate;
a channel extending between the source region and the drain region;
a gate structure configured to control current flow in the channel in response to an applied voltage, the gate structure including,
first and second U-shaped liners formed from a high-K dielectric material and a work-function metal, respectively;
a gate electrode formed on the work-function metal, the gate electrode wrapping around the channel;
a first electrical contact connected to the gate electrode; and
a second electrical contact connected to either the source region or the drain region, the first and second electrical contacts each having a lower portion and an upper portion made of two distinct non-alloy metals.

6. The device of claim 5, further comprising a first diffusion barrier lining the upper portion of the first electrical contact.

7. The device of claim 5, further comprising a second diffusion barrier lining the upper portion of the second electrical contact.

8. The device of claim 5, further comprising a third diffusion barrier lining the lower portion of the second electrical contact.

9. The device of claim 8, wherein the third diffusion barrier is made of titanium nitride (TiN).

10. The device of claim 5 wherein the upper portion is made of copper and the lower portion includes one or more of tungsten, titanium, and aluminum.

11. The device of claim 5 wherein the transistor is a FinFET.

12. The device of claim 5 wherein the gate is a metal gate.

13. The device of claim 12 wherein the metal gate includes an outer layer made of a workfunction metal.

14. The device of claim 5, further comprising sidewall spacers adjacent to the gate.

15. The device of claim 14, further comprising a cap over the gate.

16. The device of claim 15 wherein the sidewall spacers and the cap are made of silicon nitride.

17. A device, comprising:
a FinFET on a semiconductor substrate, the FinFET having
a source region formed over the semiconductor substrate;
a drain region formed over the semiconductor substrate;
a channel region extending between the source and drain regions; and
a gate structure configured to control current flow in the channel when a voltage is applied to the gate conductor, the gate structure including,
a gate conductor overlying the substrate and formed around the channel region;
a first U-shaped liner on the substrate, the first U-shaped liner being a high-K dielectric material and including sidewalls extending orthogonal to a surface of the substrate;
a second U-shaped liner over the first U-shaped liner, the second U-shaped liner formed from a work function metal material and including a recess having a lower surface proximate the substrate and sidewalls extending on the sidewalls of the first U-shaped liner; and
a first tungsten fill region formed in the recess of the second U-shaped liner; and
electrical contacts to the source region, the drain region, and the first tungsten fill region of the gate conductor, each electrical contact including a lower layer made of tungsten and an upper layer made of copper.

18. The device of claim 17 wherein the source and drain regions are raised by epitaxial growth.

19. The device of claim 17 wherein elements of the FinFET have dimensions less than 10 nm.

* * * * *